United States Patent [19]
Trimberger et al.

[11] Patent Number: 5,844,422
[45] Date of Patent: Dec. 1, 1998

[54] STATE SAVING AND RESTORATION IN REPROGRAMMABLE FPGAS

[75] Inventors: Stephen M. Trimberger, San Jose, Calif.; Jonathan S. Rose, Toronto, Canada

[73] Assignee: Xilinx, Inc., San Jose, Calif.

[21] Appl. No.: 748,443

[22] Filed: Nov. 13, 1996

[51] Int. Cl.⁶ .............................................. H03K 19/173
[52] U.S. Cl. .............................................. 326/38; 326/40
[58] Field of Search .................................. 326/38, 39, 40

[56] References Cited

U.S. PATENT DOCUMENTS

| | | | |
|---|---|---|---|
| Re. 34,363 | 8/1993 | Freeman ................................... | 307/465 |
| 5,267,187 | 11/1993 | Hsieh et al. ............................ | 364/784 |
| 5,343,406 | 8/1994 | Freeman et al. ........................ | 364/490 |
| 5,349,249 | 9/1994 | Chiang et al. ........................... | 307/465 |
| 5,414,377 | 5/1995 | Freidin ...................................... | 326/41 |
| 5,426,379 | 6/1995 | Trimberger .............................. | 326/39 |
| 5,432,719 | 7/1995 | Freeman et al. ........................ | 364/579 |

FOREIGN PATENT DOCUMENTS 63-245016 (A) 12/1988 Japan ........................... H03K 19/177

OTHER PUBLICATIONS

Xilinx, Inc., "The Programmable Logic data Book," 1994, 2–7 through 2–49, available from Xilinx, Inc., 2100 Logic Drive, San Jose, California 95124.

S. Wilton, J. Rose, Z. Vranesic, "Memory/Logic Interconnect Flexibility in FPGAs with Large Embedded Memory Arrays", IEEE CICC, May 1996, pp. 144–147.

T. Ngai, J. Rose, S. Wilton, "An SRAM–Programmable Field–Configurable Memory", IEEE CICC, Santa Clara, CA May 1995, pp. 499–502.

S. Wilton, J. Rose, Z. Vranesic, "Architecture of Centralized Field–Configurable Memory", 3rd ACM Int'l Symposium on Field–Programmable Gate–Arrays, FPGA '95, Feb. 1995, pp. 97–103.

*Primary Examiner*—Edward P. Westin
*Assistant Examiner*—Dom Le
*Attorney, Agent, or Firm*—Edel M. Young; Adam H. Tachner

[57] ABSTRACT

Structures for saving states of memory cells in an FPGA while the FPGA is being configured are shown. Structures for saving flip flop states, lookup table configurations, and block RAM states are specifically described. Structures are described having (1) a SAVE STATE bit for saving the state of each flip flop, each lookup table RAM, and each block RAM. With these structures, each storage unit can be selectively restored. (2) a SAVE STATE bit for each row (column) of logic blocks in the FPGA. In such structures it is possible with a single SAVE STATE signal to selectively save or restore every memory element in the row, possibly including flip flops, lookup tables, and blocks of RAM. Several structures and methods for providing the SAVE STATE signal are also described. These include: (1) bits in the bitstream of a first configuration which indicate which memory units of the first configuration are to be retained during a second configuration; (2) bits at the beginning of the bitstream of a second configuration which indicate which memory units of the first configuration are to be retained during a second configuration; and (3) circuit loadable during operation of a first configuration which indicates which memory units of the first configuration are to be retained during a second configuration.

24 Claims, 5 Drawing Sheets

STATE SAVING AND RESTORATION IN REPROGRAMMABLE FPGAS

FIELD OF THE INVENTION

The invention relates to field-programmable logic devices, particularly FPGAs, and to structures and methods for saving internal data states when an FPGA is reprogrammed.

BACKGROUND OF THE INVENTION

There has been increasing interest in the use of dynamically reprogrammed FPGAs, as reprogramming provides a way to re-use idle FPGA hardware, or to use the same FPGA hardware to perform several sequential operations. In a dynamically reprogrammed FPGA, the FPGA is configured for a time to perform one function of its input signals, and then is reconfigured to perform a second function of the input signals. The FPGA may be configured more times to perform third, fourth, and more functions. In addition, the FPGA may be partially reprogrammed, such that portions of the FPGA are reprogrammed while other portions remain unchanged.

Many examples of reconfigurable applications exist. For example, in a graphics application, a block of RAM in the FPGA could be used as a frame buffer, and several steps in the processing of information in the frame buffer could be performed by different configurations of the FPGA.

Using an FPGA instead of a microprocessor to respond to a series of instructions gives hardware speed instead of software speed. Each configuration can replace many microprocessor instructions. If reconfiguration of the FPGA takes 1 ms, and one FPGA configuration replaces 10,000 microprocessor instructions, then a reconfigurable FPGA can advantageously replace a microprocessor.

A key issue in developing an FPGA that can be reprogrammed and also take advantage of information generated during an earlier configuration is how to communicate the information from the earlier configuration to the later configuration. An example application in which one configuration must communicate information to another configuration is a first circuit that needs to transmit state information concerning the presence or absence of other devices in a system to a second circuit in a second configuration, or to transmit memory locations of devices in the system to a second configuration that uses the devices. Yet another example is a first configuration that downloads coefficients of filters, and then must transmit the coefficients to a second configuration that implements the filters.

FPGAs available from Xilinx, Inc., assignee of the present application, have three kinds of registers for storing user-generated data: (1) flip flops, one or more of which are present in each logic block of the FPGA; (2) lookup tables, which typically include 32 bits of RAM that can be loaded by a user and can be used to generate combinational logic functions, and in some products also used as distributed RAM; and (3) blocks of dedicated RAM available on some recent FPGA devices.

Flip flop and lookup table (function generator) structures are described at page 2–7 through 2–46 and particularly page 2–10 of the 1994 Programmable Logic Data Book available from Xilinx, Inc., assignee of the present patent application, located at 2100 Logic Drive, San Jose, Calif. 95124. Lookup tables are also described in detail by Freeman in U.S. Pat. No. Re. 34,363, incorporated herein by reference. See particularly FIGS. 3a and 3b and related discussion. Logic blocks having lookup tables usable as RAM or logic are described in detail by Freeman et al. in U.S. Pat. No. 5,432,719, also incorporated herein by reference.

Blocks of dedicated RAM are discussed in the following papers, coauthored by one of the present inventors: (1) S. Wilton, J. Rose, Z. Vranesic, "Memory/Logic Interconnect Flexibility in FPGAs with Large Embedded Memory Arrays, IEEE CICC, May 1996, pp. 144–147; (2) T. Ngai, J. Rose, S. Wilton, "An SRAM-Programmable Field-Configurable Memory" in CICC '95, IEEE CICC, Santa Clara, Calif., May 1995, pp. 499–502; and (3) S. Wilton, J. Rose, Z. Vranesic, "Architecture of Centralized Field-Configurable Memory," 3rd ACM Int'l Symposium on Field-Programmable Gate Arrays, FPGA '95, February 1995, pp. 97–103.

Current FPGA devices can not save information generated during one configuration for use during a later configuration because when current FPGAs are reconfigured all memory locations are initialized to a particular state. If it is desired to save state information, the information can be transmitted off-chip, either through a serial read-back structure present on Xilinx chips or by configuring the chip to provide certain state information to external pins for storage elsewhere. The readback procedure is very slow, and both procedures require external storage area.

Since information from one configuration is already stored in the FPGA, it is faster and requires no storage area outside the FPGA if information in these on-chip storage areas can be saved when the FPGA is reconfigured.

SUMMARY OF THE INVENTION

The invention provides ways for information that was stored on an FPGA chip during a first configuration to be saved for use during a second configuration. Revisions to current FPGA circuitry to achieve state saving are minor. Thus the invention is compatible with current applications and current FPGA structures.

According to the invention, an FPGA structure receives a state-saving signal and in response to the state saving signal maintains the states of portions of the FPGA memory so that these portions are not reconfigured during a next configuration. The configurations can be maintained either by disabling the writing of new information during the next configuration or by restoring portions of the FPGA memory after the next configuration.

Several embodiments of the invention are described for saving different kinds and different amounts of the memory from a previous configuration. Three structures are described in detail:

(1) for saving the state of a flip-flop,
(2) for saving the state of a lookup table RAM, and
(3) for saving the state of a block RAM. Structures are described having:
 (1) SAVE STATE bits that control whether the states of each flip flop, each lookup table RAM, and each block RAM are saved. With these structures, each storage unit can be selectively saved or restored;
 (2) a SAVE STATE bit for each row (column) of configurable logic blocks (CLBs). In such structures it is possible with a single SAVE STATE signal to selectively save or restore every memory element in the row of CLBs, possibly including flip flops, lookup tables, and portions of a block RAM;
 (3) a SAVE STATE bit for each quadrant or other region of the chip. In such structures it is possible for a SAVE STATE signal to save all memory states in the respective region;

(4) a global SAVE STATE bit for each type of memory, one for saving all flip flops, another for saving all lookup table RAMs and one for saving all block RAMs.

Several structures and methods for providing the SAVE STATE signal are also described. These include:

(1) bits in the bitstream of a first configuration which indicate which memory units of the first configuration are to be retained during a second configuration;

(2) bits in the bitstream of a second configuration which indicate which memory units of the first configuration are to be retained during a second configuration; and (3) information stored during operation of a first configuration which indicates which memory units of the first configuration are to be retained during a second configuration.

The structure includes a controller or many controllers that generate state saving signals and other signals during reconfiguration.

There are two ways to save memory information from one configuration to be used in a later configuration. The memory information can be captured and restored, or the memory can be prevented from changing states. Different methods may be preferred for different types of memory. For example, flip flop states (small amounts of information) may be captured and restored while block RAM memory (large amount of information) may be prevented from changing state. To cause state restoration of a flip flop to occur, a controller enabled by a SAVE STATE signal first asserts a capture signal to load a capture latch with the contents of an associated flip flop and then deasserts the capture signal. The controller also asserts a signal that allows the latch contents instead of new data to be loaded into the flip flop in response to a flip flop initialization signal, thus restoring the previous data.

DETAILED DESCRIPTION

Figure 1:
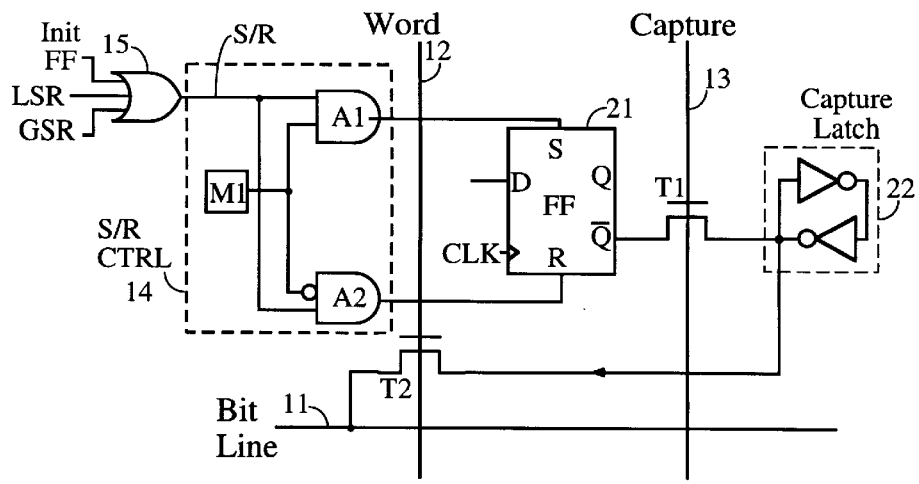
FIG. 1 shows a simplified view of a flip flop circuit that is present in logic blocks of current Xilinx FPGA devices.

FIG. 1 shows a simplified view of a circuit that is present in current Xilinx FPGA devices. Flip flop 21 is part of a configurable logic block. Such logic blocks are described in the Xilinx 1994 Programmable Logic Data Book available from Xilinx, Inc., at pages 2–7 through 2–49 and particularly at page 2–10 (incorporated herein by reference). Configurable logic blocks are also described by Hsieh et al in U.S. Pat. No. 5,267,187 and by New in U.S. Pat. No. 5,349,250. Just after the FPGA is powered up and configured, flip flop 21 in the FPGA is initialized by a high Init FF signal applied to OR gate 15. At other times flip flop 21 is initialized by a high global or local reset signal LSR or GSR applied to OR gate 15. The initial value of flip flop 21 is determined by S/R CTRL unit 14, which is programmed by a configuration memory bit M1 to either set or clear flip flop 21 in response to a high output signal S/R from OR gate 15. (The start-up sequence is discussed in detail at pages 2–28 and 2–29 of the Xilinx 1994 Data Book.) After this initialization, the FPGA is ready for operation. Any time during operation, it is possible to stop the operation and capture and read back a data bit that has been saved in flip flop 21. This is done by asserting a global capture signal on line 13, which turns on transistors such as T1 throughout the FPGA chip, and transfers the data in flip flop 21 to capture latch 22. Then in response to an address placed on the illustrated word line 12, this data bit is read onto bit line 11 and from there into a shift register (not shown), and shifted out of the FPGA chip.

Shift registers are well known. A shift register for shifting a bitstream into an FPGA is described by Freeman in U.S. Pat. No. Re. 34,363, incorporated herein by reference (see FIG. 5 and its discussion). Reading back a bitstream may be used for debugging a user's FPGA design. The read back procedure is relatively more time consuming than reading in a configuration bit stream because the capture latches are small and must slowly overcome a large capacitance on the bit lines to be properly read without the data being destroyed. But speed of read back is not important during debugging, because readback may take a few seconds and the designer may spend hours poring over the data. However, using the read back procedure for reconfiguration would require that the states be captured and slowly read back through the shift register, that a new bitstream be modified by external software to cause S/R control unit 14 to insert flip flop values found during read back, and that the new bitstream be loaded. If a readback procedure were used for reconfiguration, it would be unacceptably slow for many applications.

Flip Flop State Saving

Figure 2:
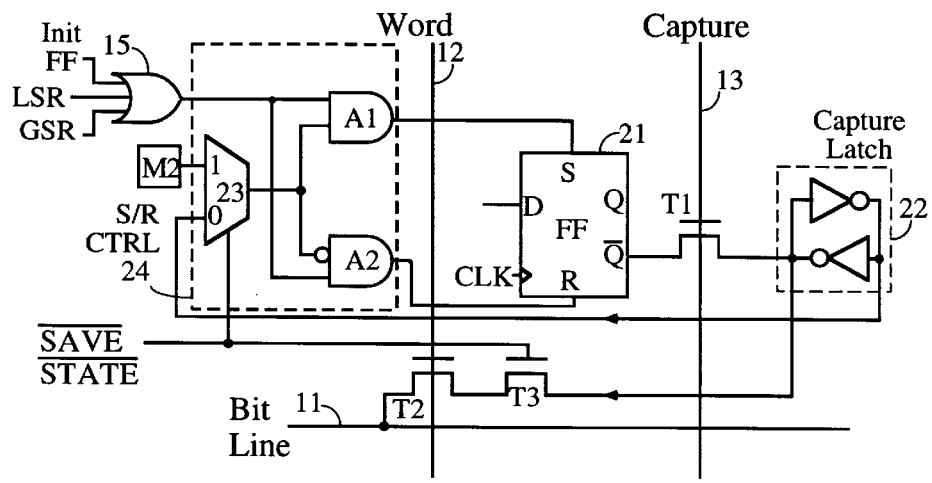
FIG. 2 shows a capture structure according to the invention for restoring the state of a flip flop.

FIG. 2 shows a capture structure according to the invention that does not require that data be read out of the chip in order to be saved and used for a later restoration. A $\overline{\text{SAVE STATE}}$ signal is provided, and controls a multiplexer 23 and transistor T3. Multiplexer 23 receives input signals from an initialization memory cell M2 and from capture latch 22 and provides an output signal for controlling S/R CONTROL unit 24.

During reconfiguration, clock signal CLK and data signal D may fluctuate in an uncontrolled manner. Therefore, the value stored in flip flop 21 might change. Thus, to save the state of flip flop 21 during reconfiguration, a high CAPTURE signal is first applied to line 13, which causes the value in flip flop 21 to be captured in latch 22. The CAPTURE signal is then brought low. The $\overline{\text{SAVE STATE}}$ signal is kept low, so that transistor T3 remains off and capture latch 22 remains connected through multiplexer 23 in S/R CONTROL unit 24 to AND gates A1 and A2. Since transistor T3 is off during configuration, external data are not inadvertently loaded into latch 22 by an address on word line 12 and data on bit line 11 connected to transistor T2. A logical 1 in capture latch 22 (which means the value in flip flop 21 was a logical 1 before reconfiguration) enables AND gate A1 to provide a SET signal in response to a high Init FF signal applied to OR gate 15, and disables AND gate A2 from providing a RESET signal in response to the high Init FF signal. Similarly, a logical 0 in capture latch 22 (which means the value in flip flop 21 was a logical 0 before reconfiguration) enables AND gate A2 to provide a RESET signal in response to a high Init FF signal applied to OR gate 15, and disables AND gate A1 from providing a SET signal in response to the high Init FF signal. The high Init FF signal is applied at the end of configuration, while $\overline{\text{SAVE STATE}}$ is still low. Thus the value that was stored in flip flop 21 before reconfiguration is returned to flip flop 21 after reconfiguration. When $\overline{\text{SAVE STATE}}$ is logical 1 during reconfiguration, multiplexer 23 applies the value stored in memory cell M2 to S/R control unit 24, which initializes flip flop 21 and thus replaces the value that was stored in flip flop 21. In the circuit of FIG. 2, it is still possible to read back values in flip flop 21 as was done in prior art FIG. 1 by holding $\overline{\text{SAVE STATE}}$ high, so devices made as in FIG. 2 are compatible with earlier devices familiar to customers.

Figure 3:
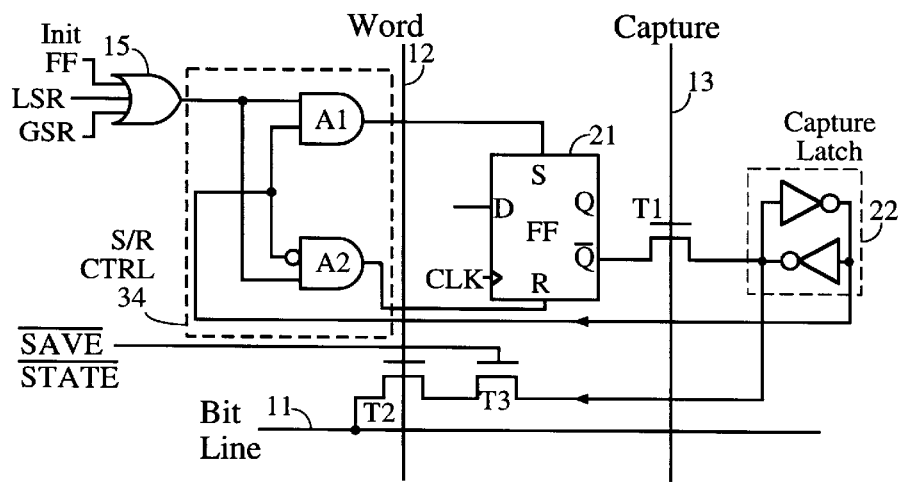
FIG. 3 shows another structure for restoring the state of a flip flop.

FIG. 3 is simpler than FIG. 2 and uses a different way to restore data from a previous configuration. In FIG. 3, the function of capture latch 22 is combined with the function of memory cell M2 of FIG. 2. Thus, in S/R control unit 34, no multiplexer 23 is provided. A previous state is saved in a manner similar to FIG. 2 because capture latch 22 drives flip flop 21, and transistor T3 prevents data in latch 22 from being overwritten. As in FIG. 2, the low $\overline{\text{SAVE STATE}}$ signal prevents the new configuration data from being loaded from bit line 11. Connecting latch 22 directly to inputs of AND gates A1 and A2 causes the former value in flip flop 21 to be restored in response to the high Init FF signal. In FIG. 3, a high $\overline{\text{SAVE STATE}}$ signal allows new configuration data to be loaded into flip flop 21. New configuration data are loaded into flip flop 21 by allowing capture latch 22 to be loaded by the normal configuration bit stream from bit line 11. A subsequent high Init FF signal causes the new value in capture latch 22 to be loaded into flip flop 21.

Figure 4:
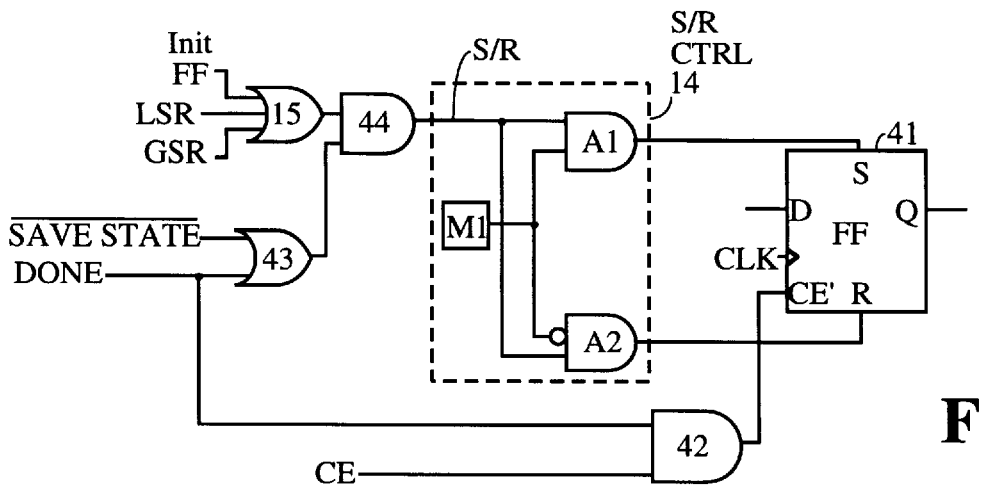
FIG. 4 shows a structure for preventing reconfiguration of a flip flop.

FIG. 4 shows another embodiment of the invention for retaining rather than restoring the state of a flip flop. In the embodiment of FIG. 4, the $\overline{\text{SAVE STATE}}$ signal prevents flip flop 41 from being reconfigured. Flip flop 41 has a clock enable terminal CE' for receiving a clock enable signal. A clock enable signal CE is provided and gated so the clock line can be non-gated and faster. According to the embodiment in FIG. 4, the clock enable signal is gated through AND gate 42 with the DONE signal, and the $\overline{\text{SAVE STATE}}$ and DONE signals are gated through OR gate 43 and further gated through AND gate 44 with the reset and initialization signals from OR gate 15.

When a reconfiguration is to be performed, the DONE signal is brought low (indicates that configuration is proceeding). If the state of flip flop 41 is to be saved, the $\overline{\text{SAVE STATE}}$ signal is brought low. The resulting low output signal from OR gate 43 disables AND gate 44 from providing a high output signal in response to reset signal InitFF or initializing signals LSR or GSR to OR gate 15. Thus line S/R in S/R CTRL unit 14 remains low during reconfiguration with state saving and the value in flip flop 41 does not change. During reconfiguration, the low DONE signal also disables AND gate 42 from responding to any clock enable signal CE by forcing AND gate 42 to provide a low clock enable signal CE' to flip flop 41. This prevents spurious CLK and D signals to flip flop 41 from changing the contents of flip flop 41. When configuration is complete and the Init FF signal has been returned to a low value, the DONE signal goes high, and flip flop 41 can again be written with a new value through either the D input or through the S/R control circuit 34.

Saving State of a Lookup Table RAM

Figure 5A:
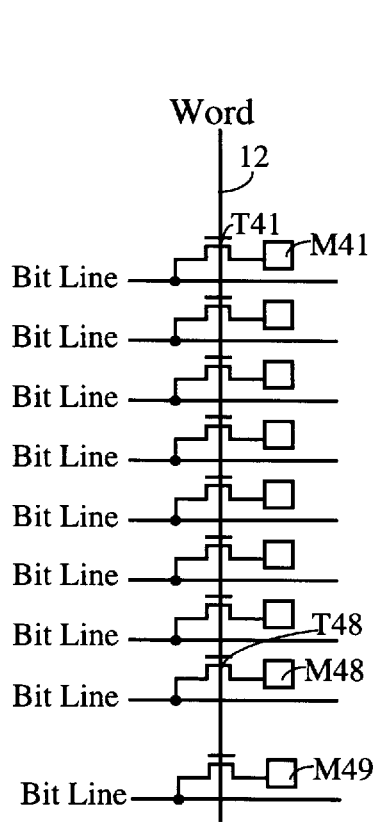
FIG. 5a shows a prior art structure for configuring a lookup table.

FIG. 5a shows a prior art structure including memory cells M41 through M48 for loading a lookup table. A bitstream configures not only a lookup table comprising memory cells M41 through M48 but additional FPGA structures such as programmable interconnection points (PIPs) and multiplexers. Memory cell M49 is a memory cell for such a purpose. Structures for loading bitstream information into an FPGA are described by Freeman in U.S. Pat. No. Re. 34,363 (see FIG. 5 of Freeman) and by Trimberger in U.S. Pat. No. 5,426,379.

These patents are incorporated by reference. In a conventional FPGA such as those available from Xilinx, Inc., each logic block includes one, two, or four lookup tables, and each lookup table comprises 16 bits of memory for generating any of over 65,000 functions of four input signals. A lookup table is described in detail by Freeman in U.S. Pat. No. Re. 34,363, incorporated herein by reference. A structure that allows a lookup table to be used as a small RAM is described by Freeman et. al in U.S. Pat. No. 5,343,406. This patent is also incorporated herein by reference.

In Xilinx devices, 16 memory cells are part of a single lookup table. Other numbers can also be used. Eight memory cells are shown in FIG. 5a. As described in U.S. Pat. No. 5,343,406, these lookup tables are also used as readable and writeable RAM. It may be desired to save the state of a lookup table RAM when reconfiguring, and yet the structure of FIG. 5a provides no way to do this state saving.

Figure 5B:
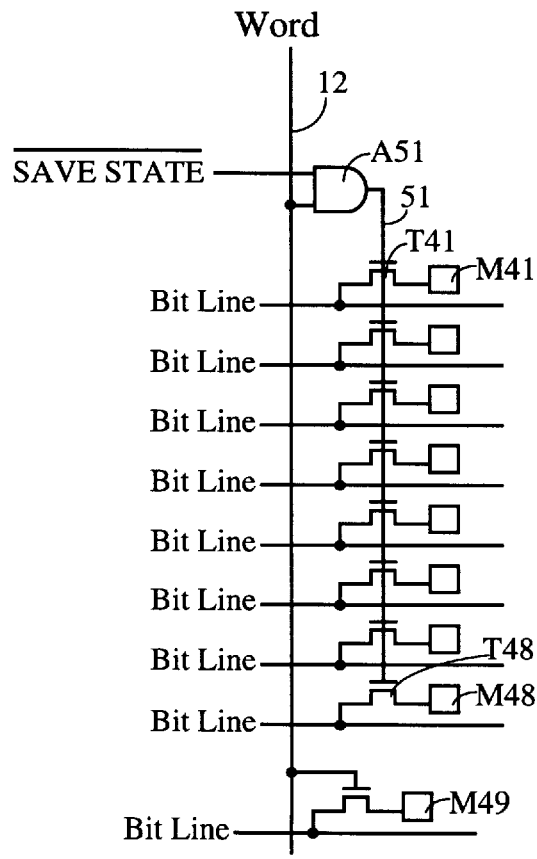
FIG. 5b shows a structure according to the invention for configuring and selectively reconfiguring a lookup table.

FIG. 5b shows a structure that can save the state of a lookup table RAM. Memory cells M41 through M48 are assumed to comprise one lookup table. The $\overline{\text{SAVE STATE}}$ signal can isolate the lookup table comprising memory cells M41 through M48 from word line 12 so that when data are placed onto the bit lines and word line 12 is brought high, lookup table line 51 remains low. AND gate A51 retains the low value on lookup table line 51 when the $\overline{\text{SAVE STATE}}$ signal is low (or when word line 12 is low). Thus all transistors T41 through T48 remain off during reconfiguration and memory cells M41 through M48 are not rewritten. While FIG. 5b shows a lookup table with bits in a single column, a lookup table may be alternatively configured using bits from multiple columns of configuration memory cells. In this case, multiple AND gates A51 will gate multiple word lines 12 with a common $\overline{\text{SAVE STATE}}$ signal.

Saving the State of a Block

Figure 6:
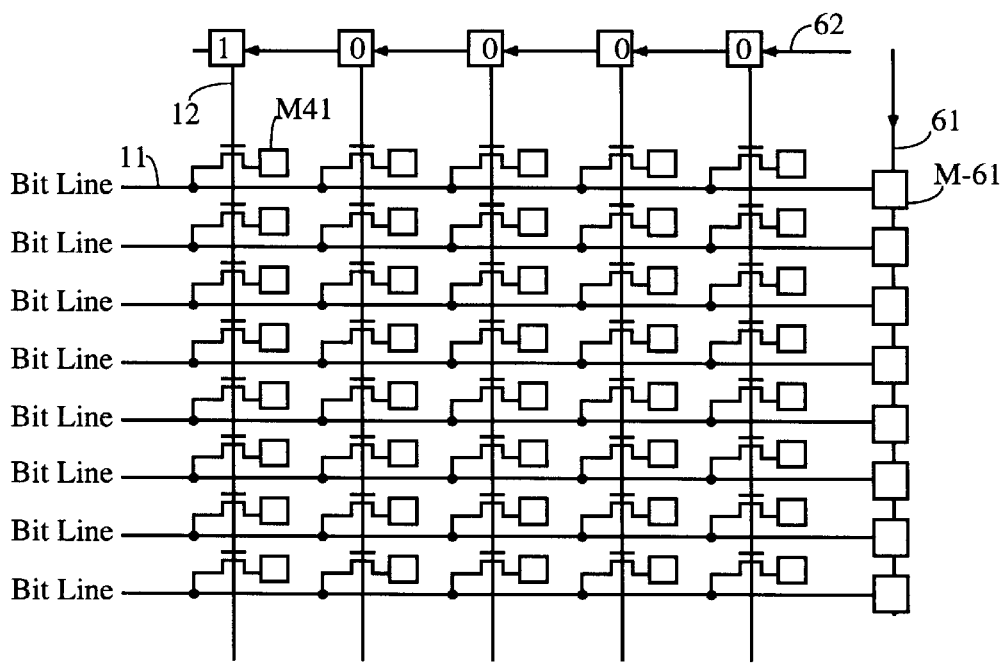
FIG. 6 shows a prior art structure for configuring an FPGA or a portion of an FPGA.

FIG. 6 shows memory cells holding configuration data for an FPGA chip. A frame shift register 61 receives a bitstream and loads the array of memory cells. Address shift register 62 selects which column of memory cells is loaded from frame shift register 61. Selection of the column is made by shifting a token logical 1 through word line register 62. In the illustration of FIG. 6, the leftmost column holds the logical 1. Thus when frame shift register 61 is filled with a frame of bitstream data, and word line 12 is high the data bit in memory cell M-61 of shift register 61, is applied to bit line 11 and loaded into memory cell M41. Other memory cells are equivalently loaded.

Figure 7:
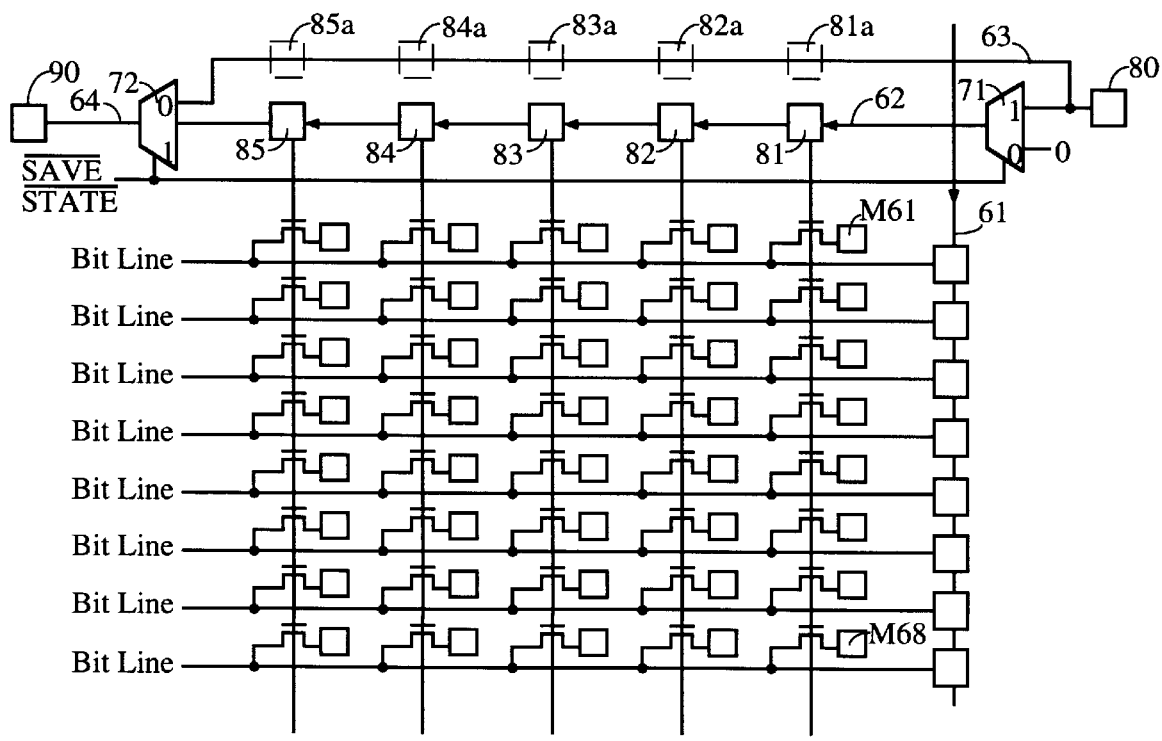
FIG. 7 shows a structure according to the invention for configuring a portion of an FPGA or a block of RAM.

FIG. 7 shows a structure for saving the state of a block of memory. In the example of FIG. 7, five columns are grouped together.

When the $\overline{\text{SAVE STATE}}$ signal is high (states are not to be saved during reconfiguration), multiplexer 71 passes the token in word line register cell 80 to word line register cell 81. When a frame of bitstream data are shifted through shift register 61 into place, a logical 1 in word line register cell 81 causes data in shift register to be shifted into the column of memory cells M61 through M68 addressed by word line register cell 81. Subsequent frames of data are loaded into subsequent columns as the token shifts to cells 82 through 85. Multiplexer 72 then shifts the token into word line register cell 90 where loading continues.

When the $\overline{\text{SAVE STATE}}$ signal is low (states are to be saved), multiplexer 71 applies a logical 0 to word line register 62 so that no word line in FIG. 7 is ever selected. Multiplexer 72 applies the word line token bit from line 63 to line 64, and other columns to the left of FIG. 7 are selected for configuration. In an embodiment that allows the same bitstream to configure or not configure the memory cells of FIG. 7, dummy token shift register bits 81a through 85a move the token to the left so that bitstream information intended for memory cells of FIG. 7 are not loaded into any memory cells. In an embodiment that uses a smaller bitstream when states will be saved, no bits 81a through 85a are provided in the FPGA, and the token shifts directly from bit 80 at the right of FIG. 7 to bit 90 at the left of FIG. 7.

The array illustrated in FIG. 7 can be an array of memory cells in a block of RAM in the FPGA or can simply be several columns of memory cells for configuring the FPGA. Any number of columns can be grouped between multiplexers such as multiplexer 71 and multiplexer 72. Thus the FPGA can be divided into areas for which state saving can be selected or not selected.

Saving State of a RAM

Figure 8:
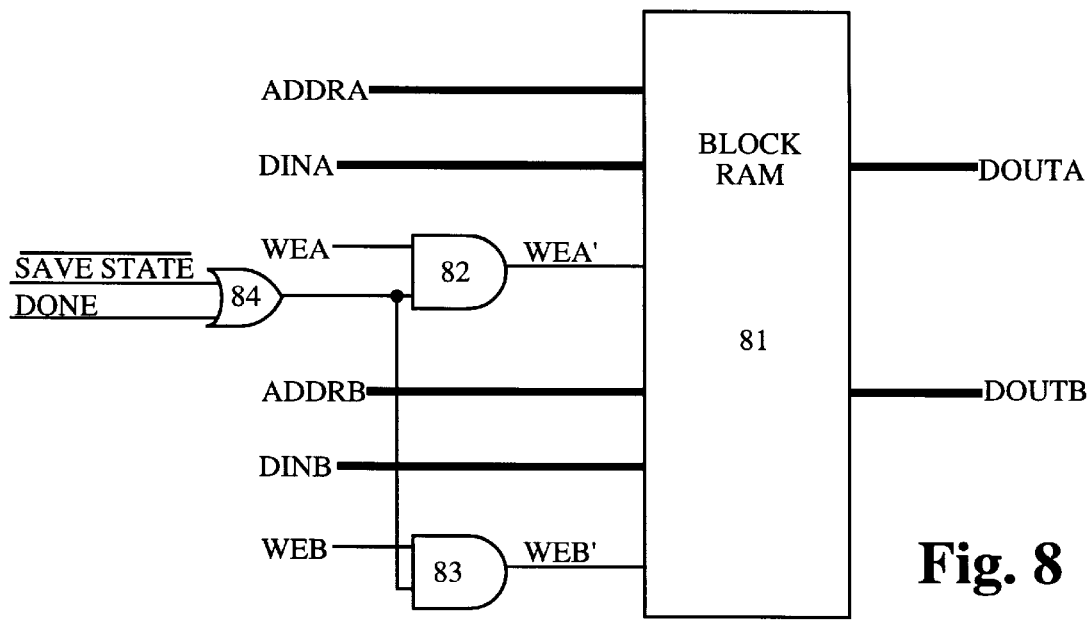
FIG. 8 shows structure according to the invention for configuring a dual port RAM block.

FIG. 8 shows external signals to a dual port RAM (a RAM in which two words of the RAM can be read or written at the same time), which is one type of block RAM. A block RAM unit typically has a write enable signal for the entire block. The write enable signal can be disabled during configuration in order to save the previous state. For the A port, address bus ADDRA identifies an address in block RAM 81. If block RAM 81 is to be written, the data on data-in bus DINA are written to the address in block RAM 81 identified by the address on address bus ADDRA. If data are to be read, the data in the address in block RAM 81 identified by the address on address bus ADDRA are placed onto data-out bus DOUTA. An equivalent procedure occurs for port B.

The structure of FIG. 8 allows state saving. As discussed above in connection with FIG. 4, when configuration is occurring the DONE signal is low. If the $\overline{\text{SAVE STATE}}$ signal is also low (the state of block RAM 81 is to be saved), the low output of OR gate 84 disables AND gates 82 and 83, so that high write enable signals WEA and WEB do not produce high write enable signals WEA' and WEB'. Thus during reconfiguration, block RAM 81 is not rewritten. As discussed above, the $\overline{\text{SAVE STATE}}$ signal may be a single global signal, or may be a locally generated signal for controlling a single block of RAM in the FPGA.

Generating and Storing the SAVE STATE Signal

Figure 9:
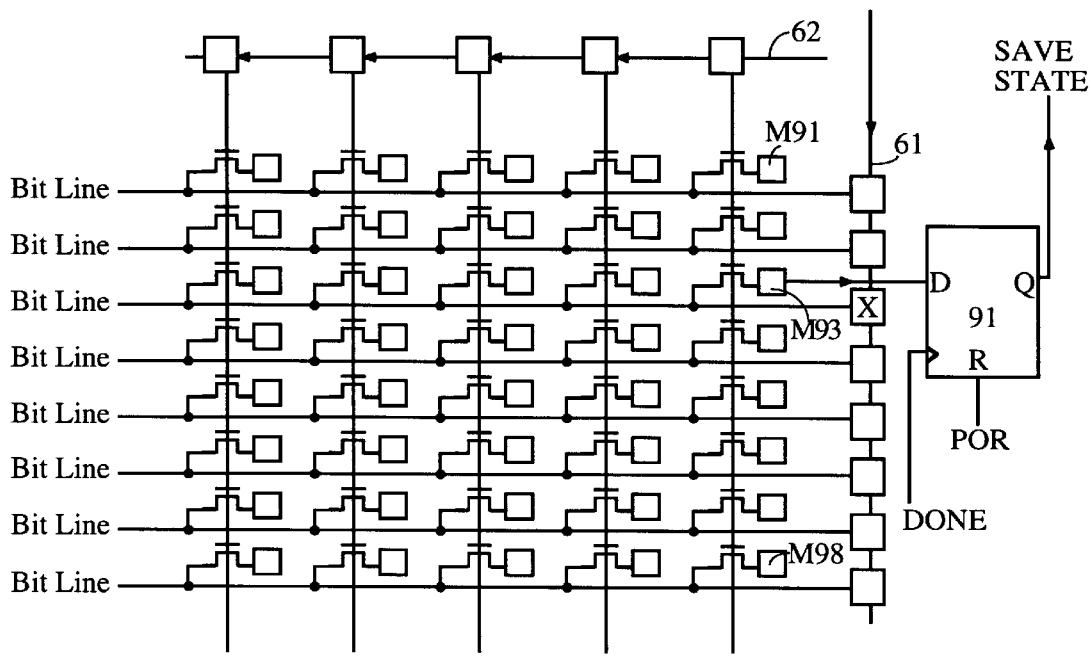
FIG. 9 shows a structure for storing a state saving signal during a first configuration and for use during a second configuration.

FIG. 9 shows a structure for loading and storing a SAVE STATE signal. The SAVE STATE signal is stored in flip flop 91. In the embodiment of FIG. 9, flip flop 91 is loaded from a bitstream 61. Bit X in the bitstream indicates whether a state is to be saved, and is loaded into configuration memory cell M93 as discussed earlier. Flip flop 91 is loaded from memory cell M93. Flip flop 91 is reset at power-up by the power-on reset signal POR, but is not reset by any reconfiguration, initialization, global reset, or local reset signals. Thus when the FPGA initially powers up, any bits controlled by the SAVE STATE signal are able to be initially configured. Bit X in the first configuration bitstream is loaded into flip flop 91 at the time when DONE goes high. The output signal from flip flop 91 is the SAVE STATE signal which is applied to one of the lines labeled SAVE STATE or inverted and applied to a $\overline{\text{SAVE STATE}}$ line shown in the earlier figures. Thus the output of flip flop 91 controls state saving during a second configuration.

Figure 10:
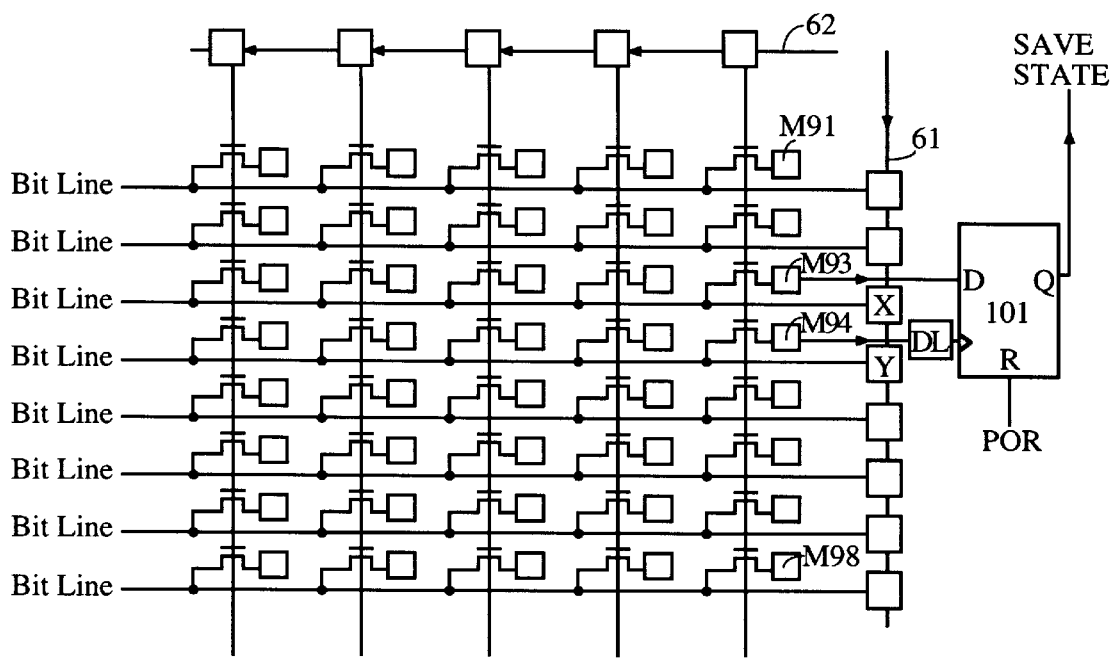
FIG. 10 shows a structure for storing and using a state saving signal during the same configuration.

Another embodiment similar to FIG. 9 is shown in FIG. 10. In FIG. 10 a logical 1 value of bit Y, when loaded into memory cell M94 causes the value in memory cell M93 to be loaded immediately into flip flop 101. When values are loaded simultaneously into memory cells M93 and M94, delay unit DL delays the logical 1 edge at the clock input of flip flop 101 until the value in cell M93 has settled. If memory cells M93 and M94 are in the first column loaded by a new bitstream, or even in a column having no other configuration bits, the SAVE STATE signal is applied to the appropriate terminals before later configuration information has been erased, and can cause state saving to occur. Alternatively, the value of memory cell M93 can be used directly as the SAVE STATE signal.

Figure 11:
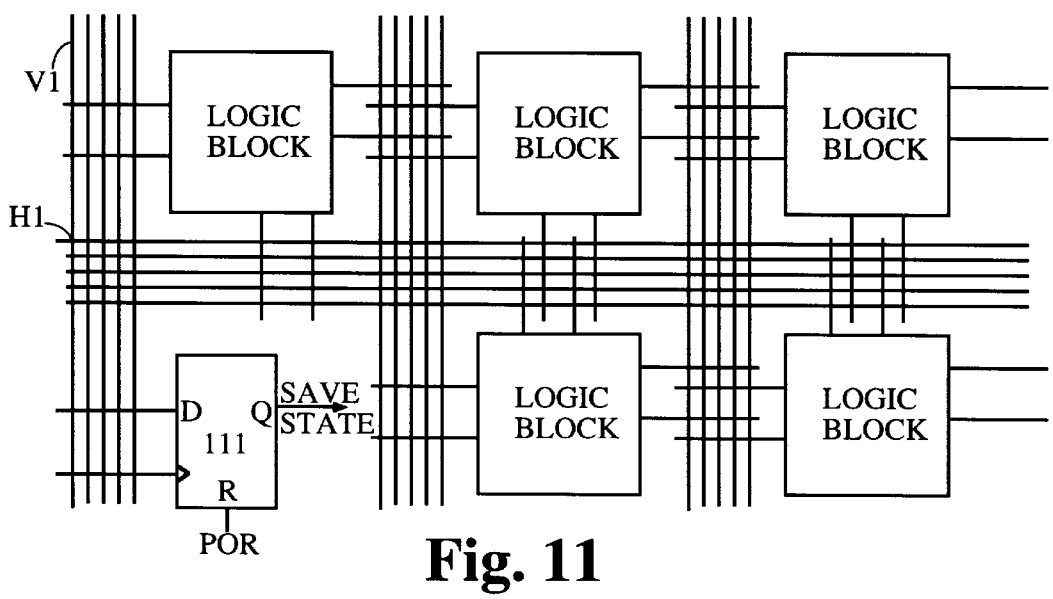
FIG. 11 shows a portion of an FPGA with a state saving flip flop loaded from the FPGA interconnect structure.

The FPGA can include selected flip flops loaded during operation of the FPGA which are not reset during reconfiguration and which are connected to state saving circuitry for saving states during a next configuration. FIG. 11 shows such a structure. The FPGA of FIG. 11 includes conventional logic blocks, labeled, and interconnect lines such as vertical interconnect line V1 and horizontal interconnect line H1. Programmable connections not shown can connect selected logic block input and output lines to the interconnect lines. According to the invention, flip flop 111 can be loaded and clocked through programmable connections to the interconnect lines. The SAVE STATE output line makes a hard connection to structures shown in earlier figures for saving states. Flip flop 111 is reset only upon power-up and not at the beginning of every configuration. Thus, flip flop 111 can hold the SAVE STATE signal and apply it during a later configuration.

Many other embodiments of the invention can be determined by those skilled in the art from the description given here. Such alternative embodiments are intended to be included within the scope of the claimed invention. For example, different structures can be built for saving different amounts, for example: everything in the FPGA, everything in one quadrant of an FPGA, everything in a row or column, all block RAMs in an FPGA, everything in one block RAM, the configuration of a particular lookup table RAM, and the configurations of all lookup table RAMs. Everywhere a user may want to save memory, there is a state-saving signal for controlling state saving to that portion of memory.

We claim:

1. A field-programmable gate array (FPGA) with state saving comprising:

a plurality of logic blocks for generating logic functions;

a plurality of registers for storing data generated by said logic functions, each of said registers having one or more states representative of said stored data;

an interconnect structure for interconnecting said logic blocks and said registers;

configuration means for configuring said logic blocks, registers, and interconnect structure to perform a function selected by a user; and state saving means for preventing said configuration means from changing the states of at least some of said registers which store said data.

2. A field-programmable gate array with state saving as in claim 1 wherein said registers are part of said logic blocks.

3. A field-programmable gate array with state saving as in claim 2 wherein said registers are flip flops.

4. A field-programmable gate array with state saving as in claim 2 wherein for each of said logic blocks, one of said registers comprises a lookup table for providing a combinational logic function of input signals to said logic block.

5. A field-programmable gate array with state saving as in claim 1 wherein said state saving means comprises a SAVE STATE signal associated with at least one register for preventing said configuration means from controlling the state of said register.

6. A field-programmable gate array with state saving as in claim 1 wherein said state saving means comprises a SAVE STATE signal associated with each row of logic blocks in said FPGA for preventing said configuration means from controlling the state of said row of logic blocks.

7. A field-programmable gate array with state saving comprising:
   a plurality of logic blocks for generating logic functions;
   a plurality of registers for storing said logic functions, wherein said registers comprise a block of RAM cells accessed by at least one of said logic blocks;
   an interconnect structure for interconnecting said logic blocks and said registers;
   configuration means for configuring said logic blocks, registers, and interconnect structure to perform a function selected by a user;
   state saving means for preventing said configuration means from changing the content of at least some of said registers.

8. A field-programmable gate array with state saving comprising:
   a plurality of logic blocks for generating logic functions;
   a plurality of registers for storing said logic functions;
   an interconnect structure for interconnecting said logic blocks and said registers;
   configuration means for configuring said logic blocks, registers, and interconnect structure to perform a function selected by a user; and
   state saving means for preventing said configuration means from changing the content of at least some of said registers, wherein a SAVE STATE signal is generated by said field-programmable gate array during a first configuration and prevents said configuration means from configuring during a second configuration following said first configuration.

9. A field-programmable gate array (FPGA) with state saving comprising:
   a plurality of logic blocks for generating logic functions;
   a plurality of registers for storing said logic functions;
   an interconnect structure for interconnecting said logic blocks and said registers;
   configuration means for configuring said logic blocks, registers, and interconnect structure to perform a function selected by a user; and
   state saving means for preventing said configuration means from changing the content of at least some of said registers, wherein said state saving means comprises a SAVE STATE signal associated with each block random access memory (RAM) in said FPGA for preventing said configuration means from controlling the state of said block RAM.

10. A field-programmable gate array with state saving comprising:
    a plurality of logic blocks for generating logic functions;
    a plurality of registers for storing said logic functions;
    an interconnect structure for interconnecting said logic blocks and said registers;
    configuration means for configuring said logic blocks, registers, and interconnect structure to perform a function selected by a user; and
    state saving means for preventing said configuration means from changing the content of at least some of said registers, wherein said state saving means includes means connected to a flip flop in at least one of said logic blocks for preventing said configuration means from changing the content of said flip flop in response to a SAVE STATE signal.

11. A field-programmable gate array with state saving comprising:
    a plurality of logic blocks for generating logic functions;
    a plurality of registers for storing said logic functions;
    an interconnect structure for interconnecting said logic blocks and said registers;
    configuration means for configuring said logic blocks, registers, and interconnect structure to perform a function selected by a user; and
    state saving means for preventing said configuration means from changing the content of at least some of said registers, wherein said state saving means includes means connected to a memory cell in at least one of said logic blocks for preventing said configuration means from configuring said memory cell in response to a SAVE STATE signal.

12. A field-programmable gate array with state saving as in claim 11 wherein said memory cell is part of a lookup table.

13. A field-programmable gate array with state saving comprising:
    a plurality of logic blocks for generating logic functions;
    a plurality of registers for storing said logic functions;
    an interconnect structure for interconnecting said logic blocks and said registers;
    configuration means for configuring said logic blocks, registers, and interconnect structure to perform a function selected by a user; and
    state saving means for preventing said configuration means from changing the content of at least some of said registers, wherein said state saving means includes means connected to a block RAM accessible to at least one of said logic blocks for preventing said configuration means from changing the content of said block RAM in response to a SAVE STATE signal.

14. A field-programmable gate array with state saving comprising:
    a plurality of logic blocks for generating logic functions;
    a plurality of registers for storing said logic functions;
    an interconnect structure for interconnecting said logic blocks and said registers;
    configuration means for configuring said logic blocks, registers, and interconnect structure to perform a function selected by a user; and
    state saving means for preventing said configuration means from changing the content of at least some of said registers, wherein a SAVE STATE signal is provided as part of a bitstream controlling said configuration means and prevents said state saving means from configuring at least some of said registers.

15. A field-programmable gate array with state saving as in claim 14 wherein said SAVE STATE signal is part of a first bitstream that established a configuration that writes to said registers.

16. A field-programmable gate array with state saving as in claim 14 wherein said SAVE STATE signal is part of a second bitstream that is loaded after said registers have been written to.

17. A field-programmable gate array with state saving comprising:

a plurality of logic blocks for generating logic functions;

a plurality of registers for storing said logic functions;

an interconnect structure for interconnecting said logic blocks and said registers;

configuration means for configuring said logic blocks, registers, and interconnect structure to perform a function selected by a user; and state saving means for preventing said configuration means from changing the content of at least some of said registers, wherein said state saving means prevents said configuration means from initializing a flip flop formed as part of one of said logic blocks.

18. A field-programmable gate array with state saving as in claim 17 wherein a state saved by said state saving means is saved by a logic gate that disables a reset signal.

19. A field-programmable gate array with state saving as in claim 17 wherein a state saved by said state saving means is saved by a logic gate that disables a clock enable signal.

20. A field-programmable gate array with state saving as in claim 17 wherein a state saved by said state saving means is saved by saving a value in said flip flop to a capture location within said field-programmable gate array and rewriting said value from said capture location to said flip flop.

21. A field-programmable gate array (FPGA) with state saving comprising:

a plurality of logic blocks for generating logic functions;

a plurality of registers for storing said logic functions;

an interconnect structure for interconnecting said logic blocks and said registers;

configuration means for configuring said logic blocks, registers, and interconnect structure to perform a function selected by a user; and state saving means for preventing said configuration means from changing the content of at least some of said registers, wherein said state saving means comprises a SAVE STATE signal associated with a type of memory in said FPGA for preventing said configuration means from controlling the states of registers of said type of memory.

22. In a field-programmable gate array (FPGA) having a structure for configuring said FPGA and a structure for saving states of registers in said FPGA which states are representative of information generated by an earlier configuration of the FPGA, a method of operating said FPGA comprising:

a) configuring said FPGA;

b) activating said structure for saving said states; and c) configuring said FPGA again.

23. A field-programmable gate array (FPGA) comprising:

a) a plurality of logic blocks having a first configuration for generating data;

b) a plurality of memory cells the states of which are representative of data generated by the logic blocks having the first configuration;

c) an interconnect structure for interconnecting the logic blocks and the memory cells;

d) a reconfiguration circuit for reconfiguring the logic blocks, memory cells, and interconnect structure to have a second configuration selected by a user; and e) state saving means for preventing the reconfiguration means from changing the states of at least some of the memory cells, in order to preserve the states representative of data generated by the logic blocks having the first configuration and allow at least some of the logic blocks in the second configuration to use the data generated by the logic blocks of the first configuration.

24. In a field programmable gate array (FPGA) having a structure for configuring the FPGA and a structure for saving states of registers in the FPGA which states are representative of information generated by an earlier configuration of the FPGA, a method of operating the FPGA comprising:

a) configuring the FPGA;

b) generating information using the FPGA and storing state information representative of the generated information;

c) activating the structure for saving states;

d) reconfiguring the FPGA; and e) generating new information using the reconfigured FPGA and the stored state information.

* * * * *